US010643883B2

United States Patent
Chen et al.

(10) Patent No.: US 10,643,883 B2
(45) Date of Patent: May 5, 2020

(54) METHOD OF FORMING ISOLATION STRUCTURE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Po-Chun Chen, Tainan (TW); Hsuan-Tung Chu, Tainan (TW); Yi-Wei Chen, Taichung (TW); Wei-Hsin Liu, Changhua County (TW); Yu-Cheng Tung, Kaohsiung (TW); Chia-Lung Chang, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/134,982

(22) Filed: Sep. 19, 2018

(65) Prior Publication Data
US 2020/0075397 A1    Mar. 5, 2020

(30) Foreign Application Priority Data
Aug. 29, 2018    (CN) .......................... 2018 1 0995795

(51) Int. Cl.
*H01L 21/76* (2006.01)
*H01L 21/762* (2006.01)
*H01L 21/02* (2006.01)

(52) U.S. Cl.
CPC .... *H01L 21/76224* (2013.01); *H01L 21/0228* (2013.01); *H01L 21/0254* (2013.01); *H01L 21/02554* (2013.01)

(58) Field of Classification Search
CPC ................................................. H01L 21/76229
See application file for complete search history.

(56) References Cited

U.S. PATENT DOCUMENTS

| | | | | |
|---|---|---|---|---|
| 4,871,689 A | * | 10/1989 | Bergami | H01L 21/3145 438/427 |
| 8,399,363 B1 | * | 3/2013 | Lee | H01L 21/76229 438/427 |
| 2004/0032006 A1 | * | 2/2004 | Yun | H01L 21/76229 257/510 |
| 2005/0079730 A1 | * | 4/2005 | Beintner | H01L 21/76229 438/758 |
| 2012/0276713 A1 | * | 11/2012 | Miyahara | H01L 21/76224 438/427 |
| 2013/0249048 A1 | * | 9/2013 | Kim | H01L 27/10894 257/506 |
| 2014/0159193 A1 | * | 6/2014 | Kim | H01L 29/0649 257/513 |

* cited by examiner

*Primary Examiner* — Angel Roman
(74) *Attorney, Agent, or Firm* — Winston Hsu

(57) ABSTRACT

A method of forming an isolation structure includes the following steps. A substrate having a first trench, a second trench and a third trench is provided, wherein the opening of the third trench is larger than the opening of the second trench, and the opening of the second trench is larger than the opening of the first trench. A first oxide layer is formed to conformally cover the first trench, the second trench and the third trench by an atomic layer deposition (ALD) process. A second oxide layer fills up the first trench by an in-situ steam generation (ISSG) process.

15 Claims, 6 Drawing Sheets

METHOD OF FORMING ISOLATION STRUCTURE

BACKGROUND OF THE INVENTION

1. Field of the Invention

The present invention relates generally to a method of forming an isolation structure, and more specifically to a method of forming an isolation structure applying an in-situ steam generation (ISSG) process to fill up recesses.

2. Description of the Prior Art

Due to integrated circuit devices evolving to be smaller and smaller and an increase of integration, distances and arrangements between devices within a semiconductor substrate are decreasing and becoming more tight. Therefore, suitable insulating or isolation has to be formed between each device to prevent each device from junction current leakage, and an insulating or isolation region is reduced to enhance integration in a perfect isolation. In various device isolation technologies, localized oxidation isolation (LOCOS) and shallow trench isolation (STI) are the most often used. In particular, STI has advantages of a smaller isolation region and retaining planarization of the semiconductor substrate. The prior art STI structure is formed between two metal oxide semiconductor (MOS) transistors and surrounds an active region in the semiconductor substrate to prevent carriers, such as electrons or electric holes, from drifting between two adjacent devices through the substrate to cause junction current leakage. STI not only isolates each device effectively but is also inexpensive, which suits semiconductor processes with high integration. Improved isolation structure with high quality is required in the industry.

SUMMARY OF THE INVENTION

The present invention provides a method of forming an isolation structure, which fills up recesses with an oxide layer formed by an in-situ steam generation (ISSG) process, and thus gap filling capability can be improved and uneven stresses can be avoided.

The present invention provides a method of forming an isolation structure including the following steps. A substrate having a first trench, a second trench and a third trench is provided, wherein the opening of the third trench is larger than the opening of the second trench, and the opening of the second trench is larger than the opening of the first trench. A first oxide layer conformally covering the first trench, the second trench and the third trench is formed by an atomic layer deposition (ALD) process. The first trench is filled up with a second oxide layer by an in-situ steam generation (ISSG) process.

According to the above, the present invention provides a method of forming an isolation structure, which forms a first oxide layer conformally covering a first trench by an atomic layer deposition (ALD) process; a second oxide layer fills up the first trench by an in-situ steam generation (ISSG) process. This improves gap filling capability of the first trench, and stresses from different directions are uniform by filling the second oxide layer into the first trench through an in-situ steam generation (ISSG) process, and thus structural bending caused by the stresses can be avoided.

The second oxide layer may fill up the first trench of a high aspect ratio by an in-situ steam generation (ISSG) process, but partially fill the second trench and the third trench of larger openings, and then these trenches with larger openings may be filled up by nitride layers or/and oxide layers in later processes.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
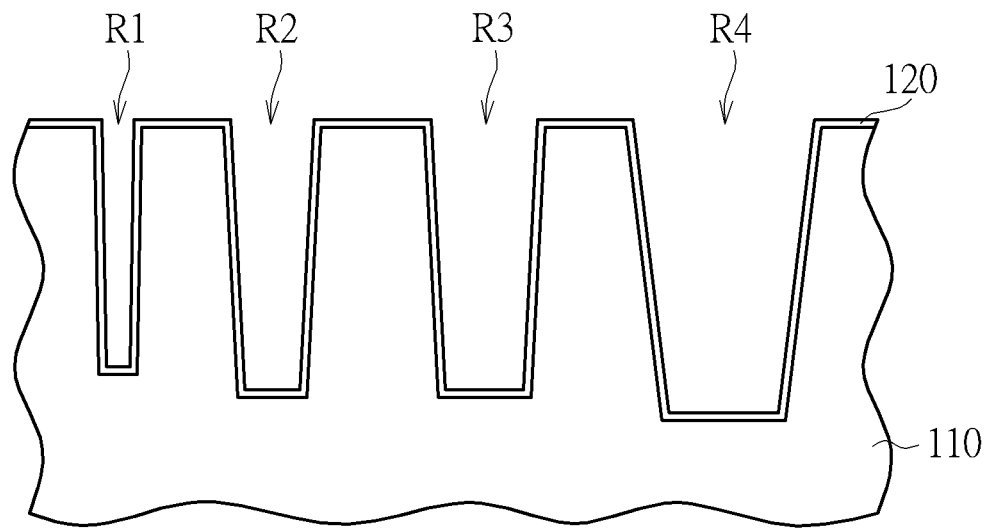
FIG. 1 schematically depicts a cross-sectional view of a method of forming an isolation structure according to an embodiment of the present invention.

FIGS. 1-8 schematically depict cross-sectional views of a method of forming an isolation structure according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. Recesses R1/R2/R3/R4 are formed in the substrate 110, wherein the opening of the recess R4 is larger than the opening of the recess R3, the opening of the recess R3 is larger than the opening of the recess R2, and the opening of the recess R2 is larger than the opening of the recess R1. Methods of forming the recesses R1/R2/R3/R4 may include the following steps. A hard mask layer (not shown) blanketly covers the substrate 110, the hard mask layer is patterned to expose a part of the substrate 110 for forming the recesses R1/R2/R3/R4, the exposed part of the substrate 110 is etched to form the recesses R1/R2/R3/R4, and then the hard mask layer is removed. The hard mask layer may include a pad oxide layer (not shown) and a pad nitride layer (not shown) stacked from bottom to top, but it is not limited thereto. The recesses R1/R2/R3/R4 may represent the cross-sectional views of recesses in different areas or at different directions, and these recesses all depict in one planar in these figures for simplification. For example, the recess R1 may be a cross-sectional view of a recess located between active areas parallel to each other, the recess R2 may be a cross-sectional view of a recess located between tips of active areas, and the recesses R3/R4 may be cross-sectional views of recesses located between active areas in periphery areas, but it is not limited thereto. Four recesses R1/R2/R3/R4 are depicted in this embodiment, but the numbers of the recesses R1/R2/R3/R4 are not restricted thereto.

As shown in FIG. 1, a first oxide layer 120 is formed to conformally cover the recesses R1/R2/R3/R4, wherein the first oxide layer 120 is formed by an atomic layer deposition (ALD) process, and the thickness of the first oxide layer 120 may be 80 angstroms, but it is not limited thereto.

Figure 2:
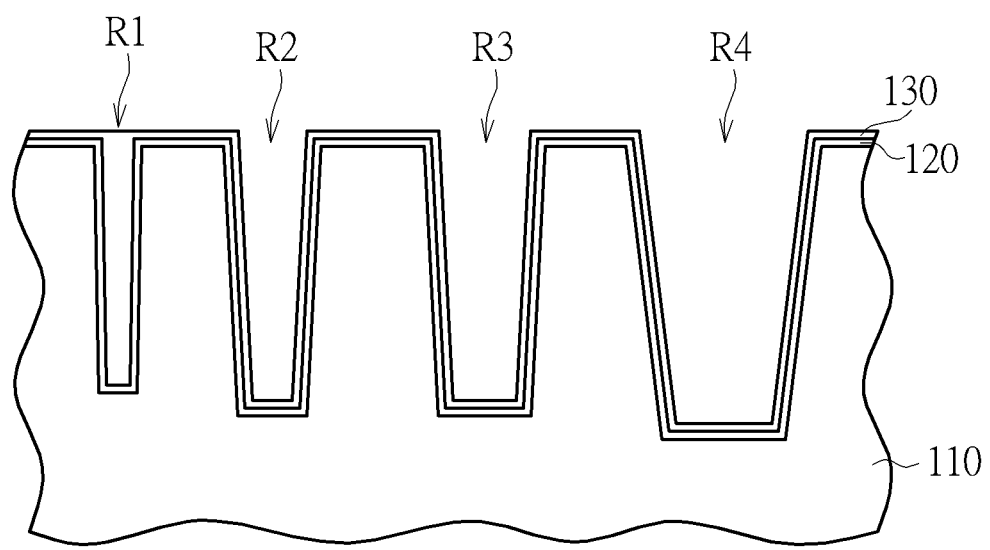
FIG. 2 schematically depicts a cross-sectional view of a method of forming an isolation structure according to an embodiment of the present invention.
Figure 9:
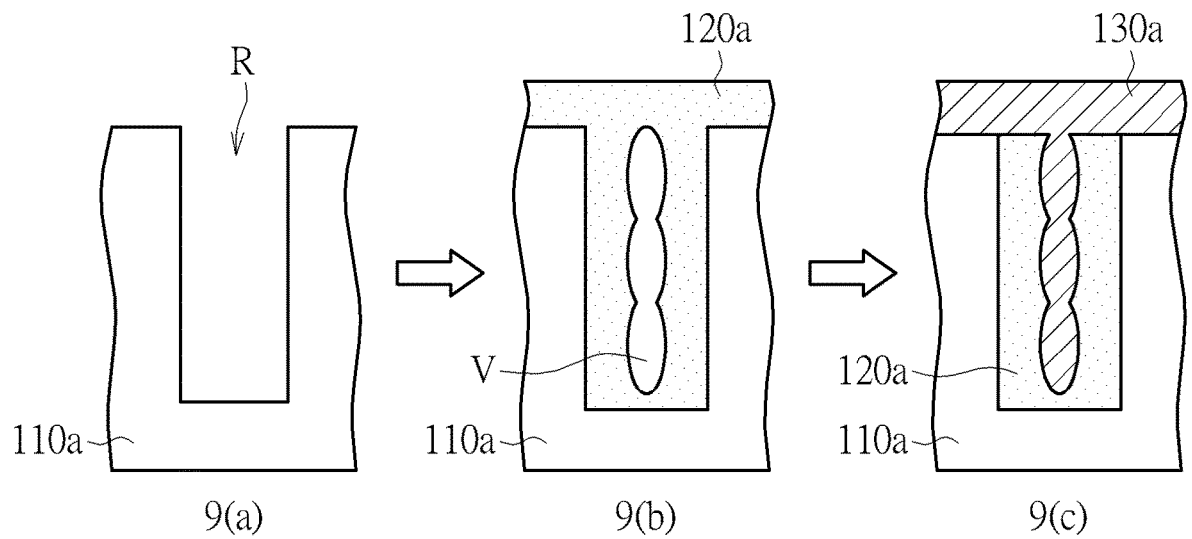
FIG. 9 schematically depicts a cross-sectional view of a method of forming an isolation structure according to another embodiment of the present invention.

As shown in FIG. 2, a second oxide layer 130 is formed on the first oxide layer 120, only fills up the recess R1, and partially fills up the recesses R2/R3/R4 by an in-situ steam generation (ISSG) process. In this embodiment, the first oxide layer 120 unsealing the recess R1 is formed by an atomic layer deposition (ALD) process, and then the second oxide layer 130 is formed by an in-situ steam generation (ISSG) process to fill up the recess R1. In another embodiment, a first oxide layer may seal the recess R1, and then the second oxide layer fills up voids in the recess R1, as shown in the following. FIG. 9 schematically depicts a cross-sectional view of a method of forming an isolation structure according to another embodiment of the present invention. As shown in FIG. 9, a recess R is formed in a substrate 110a as shown in FIG. 9(a), a first oxide layer 120a is formed by an atomic layer deposition (ALD) process to conformally cover the recess R and seal the opening of the recess R as shown in FIG. 9(b), and then a second oxide layer 130a is formed by an in-situ steam generation (ISSG) process to fill up a void V in the recess R as shown in FIG. 9(c). Due to the second oxide layer 130/130a filling up the recess R1/R by an in-situ steam generation (ISSG) process, the gap filling capability of the recess R1/R having high aspect ratio can be improved. Besides, the stresses from different directions can be uniform and structural bending caused by stresses can be avoided.

Figure 3:
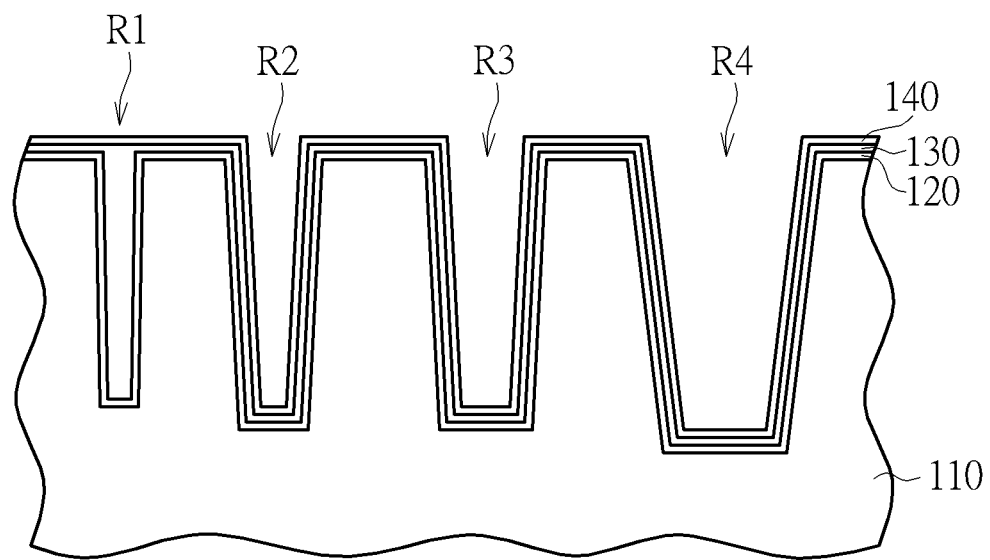
FIG. 3 schematically depicts a cross-sectional view of a method of forming an isolation structure according to an embodiment of the present invention.

As shown in FIG. 3, an oxide layer 140 (fifth oxide layer) may be selectively formed to conformally cover the second oxide layer 130, wherein the oxide layer 140 may be formed by an atomic layer deposition (ALD) process, and the thickness of the oxide layer 140 may be 35 angstroms, but it is not limited thereto. Since the second oxide layer 130 fills up the recess R1, the oxide layer 140 is formed only above the recess R1, and the oxide layer 140 conformally covers the second oxide layer 130 in the recesses R2/R3/R4.

Figure 11:
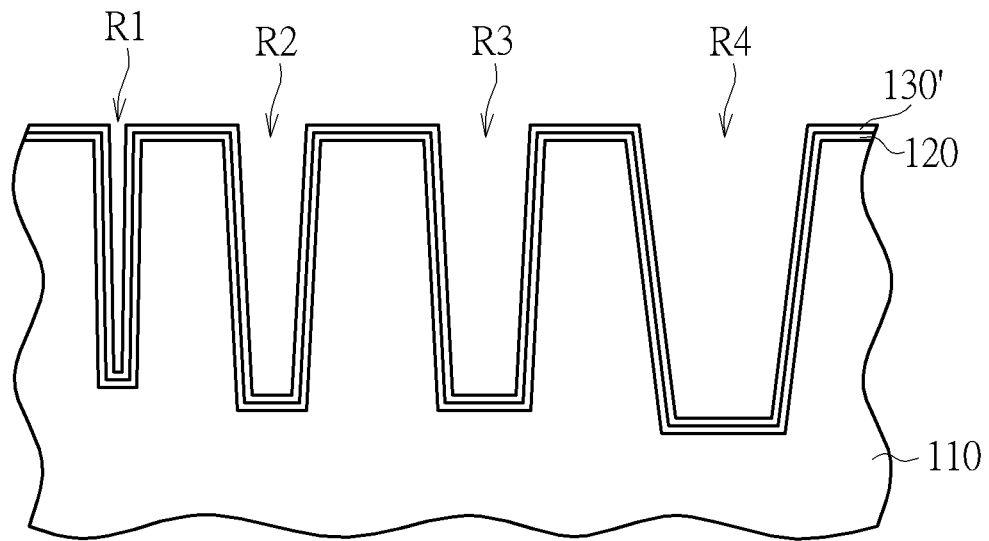
FIG. 11 schematically depicts a cross-sectional view of a method of forming an isolation structure according to another embodiment of the present invention.
Figure 12:
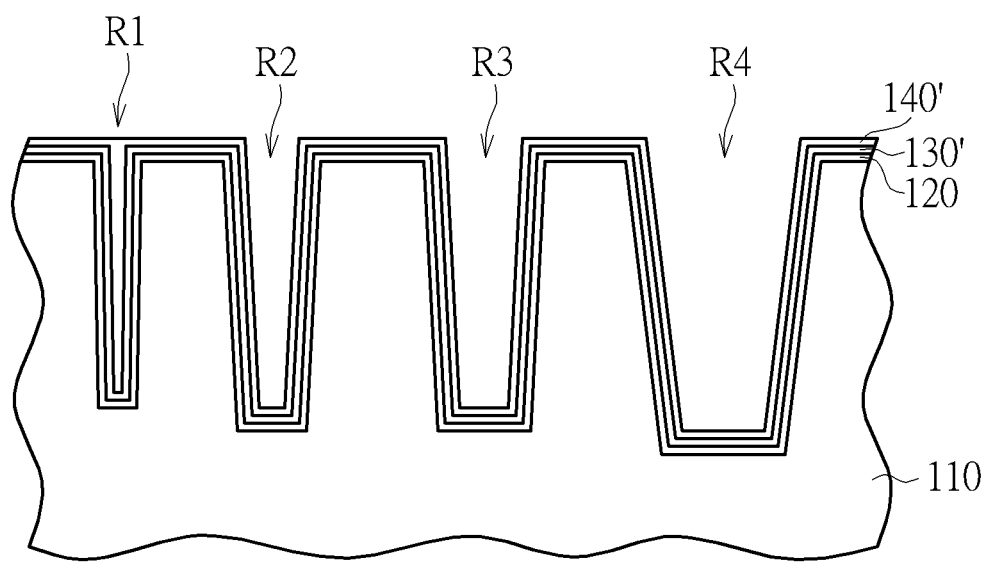
FIG. 12 schematically depicts a cross-sectional view of a method of forming an isolation structure according to another embodiment of the present invention.

In another embodiment, please refer to FIGS. 11-12. After the first oxide layer 120 is formed to conformally cover the recesses R1/R2/R3/R4 as shown in FIG. 1, a second oxide layer 130' is formed on the first oxide layer 120 and partially fills up the recesses R1/R2/R3/R4 by an in-situ steam generation (ISSG) process instead as shown in FIG. 11. Then, an oxide layer 140' (fifth oxide layer) only fills up the recess R1, partially fills up the recesses R1/R2/R3/R4, and is formed on the second oxide layer 130', as shown in FIG. 12.

Figure 4:
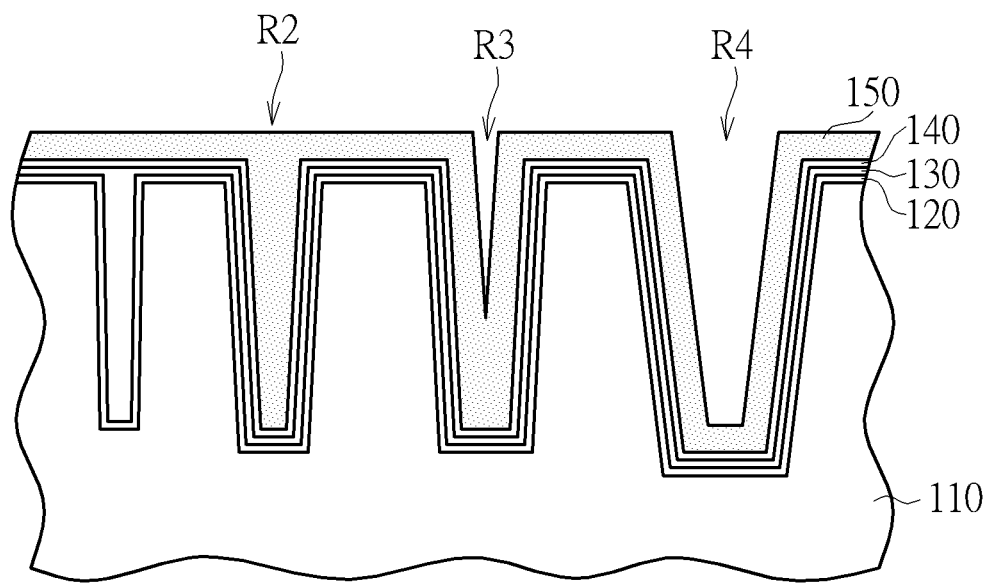
FIG. 4 schematically depicts a cross-sectional view of a method of forming an isolation structure according to an embodiment of the present invention.

As shown in FIG. 4, a first nitride layer 150 is formed on the oxide layer 140/the second oxide layer 130 and fills up the recess R2, but conformally covers and partially fills the recesses R3/R4. The first nitride layer 150 may be formed by an atomic layer deposition (ALD) process, and the thickness of the first nitride layer 150 may be 170 angstroms, but it is not limited thereto. The first nitride layer 150 is formed only above the recess R1, fills up the recess R2, and conformally covers the oxide layer 140/the second oxide layer 130 in the recess R3/R4.

Figure 10:
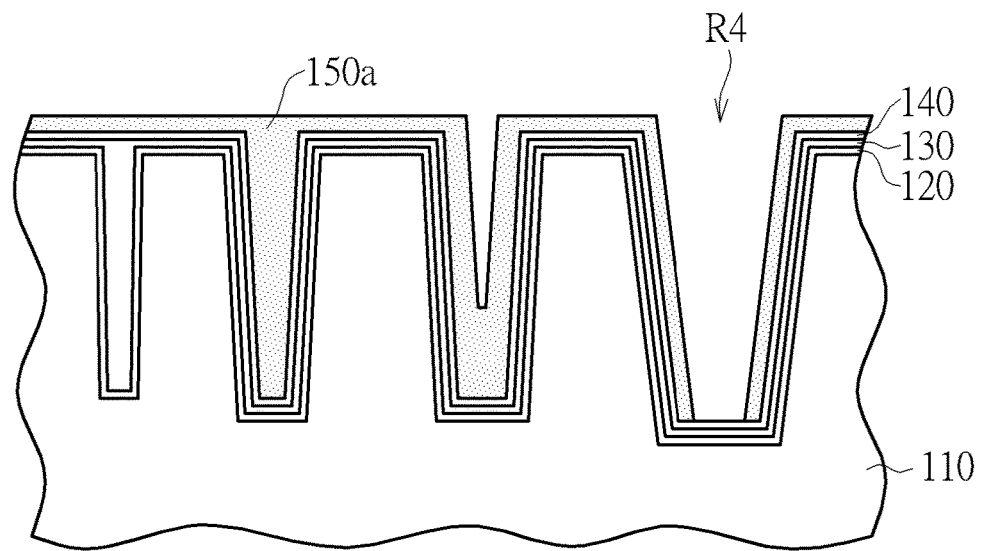
FIG. 10 schematically depicts a cross-sectional view of a method of forming an isolation structure according to another embodiment of the present invention.

In this embodiment, the first nitride layer 150 may be selectively etched back to thin down the thickness of the first nitride layer 150, thereby oxide layers can filling into the recess R3/R4 easier in later processes, and thus improving gap filling capability. As shown in FIG. 10, the first nitride layer 150 is etched back until the oxide layer 140 in the recess R4 being exposed, thereby a first nitride layer 150a being formed, but it is not limited thereto. The etching back process has a high etching selectivity to a nitride layer and an oxide layer, meaning the etching rate of the etching back process to the nitride layer being much larger than the etching rate of the etching back process to the oxide layer. Therefore, the oxide layer can serve as an etch stop layer and a part of the nitride layer can be removed.

Figure 5:
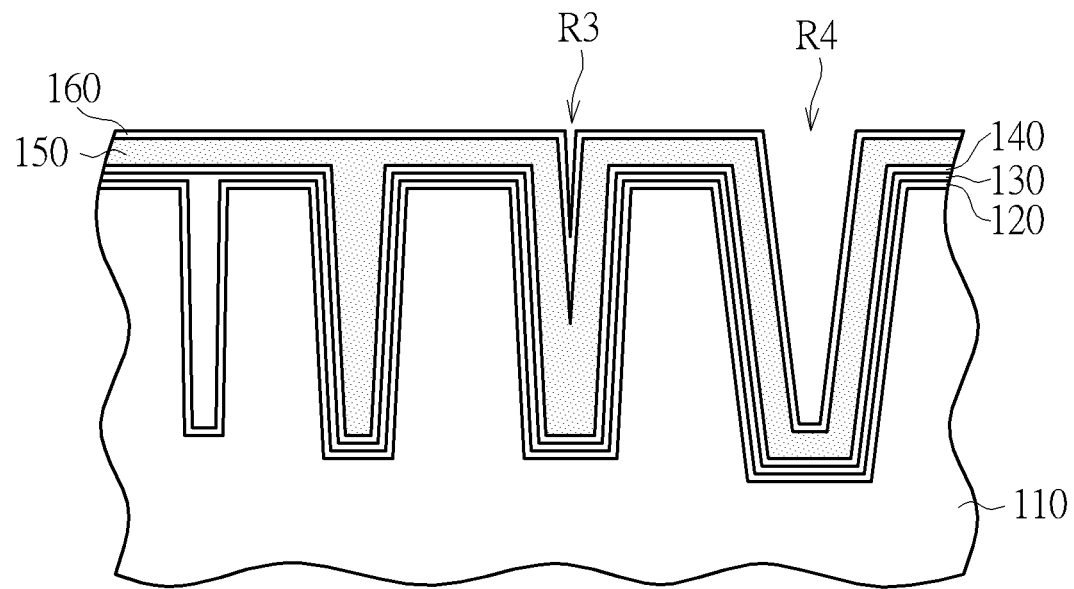
FIG. 5 schematically depicts a cross-sectional view of a method of forming an isolation structure according to an embodiment of the present invention.

As shown in FIG. 5, a third oxide layer 160 is formed to conformally cover the first nitride layer 150. In this embodiment, the third oxide layer 160 is formed by an atomic layer deposition (ALD) process, and the thickness of the third oxide layer 160 is 50 angstroms, but it is not limited thereto.

Figure 6:
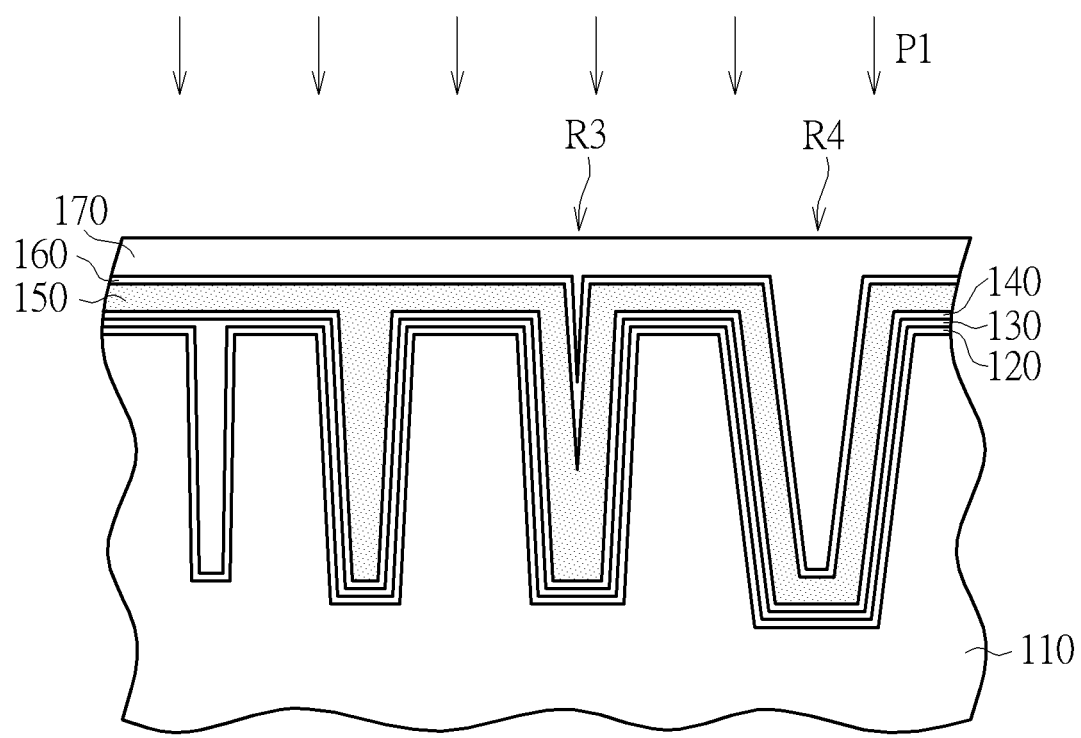
FIG. 6 schematically depicts a cross-sectional view of a method of forming an isolation structure according to an embodiment of the present invention.

As shown in FIG. 6, a fourth oxide layer 170 fills up the recesses R3/R4 by a spin-on-dielectric (SOD) process, wherein the spin-on-dielectric (SOD) process may be a spin-on-coating (SOD) process, but it is not limited thereto. A first annealing process P1 may be performed to cure the fourth oxide layer 170, wherein the processing temperature of the first annealing process P1 is 900° C., but it is not limited thereto.

Figure 7:
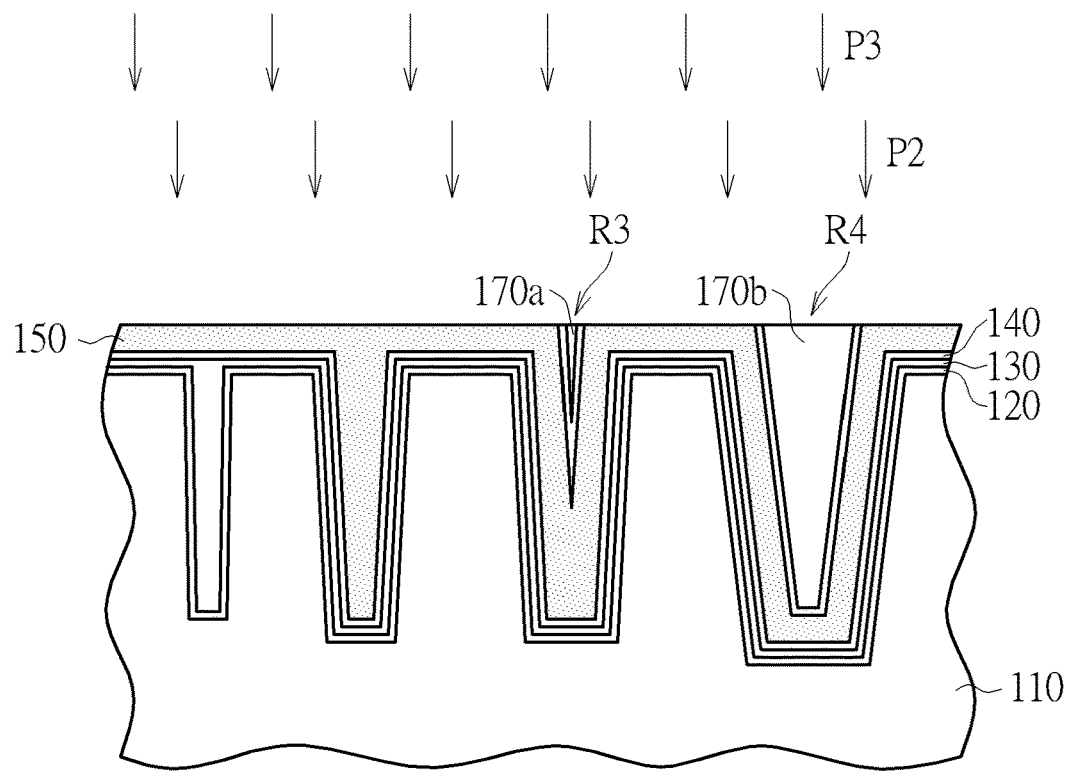
FIG. 7 schematically depicts a cross-sectional view of a method of forming an isolation structure according to an embodiment of the present invention.

A chemical mechanical polishing (CMP) process P2 is performed to polish the fourth oxide layer 170 until the first nitride layer 150 being exposed, thereby a fourth oxide layer 170a being formed in the recess R3 and a fourth oxide layer 170b being formed in the recess R4, as shown in FIG. 7. After the chemical mechanical polishing (CMP) process P2 is performed, a second annealing process P3 is performed to densify the fourth oxide layer 170a and the fourth oxide layer 170b, wherein the processing temperature of the second annealing process P3 is 1000° C., but it is not limited thereto.

Figure 8:
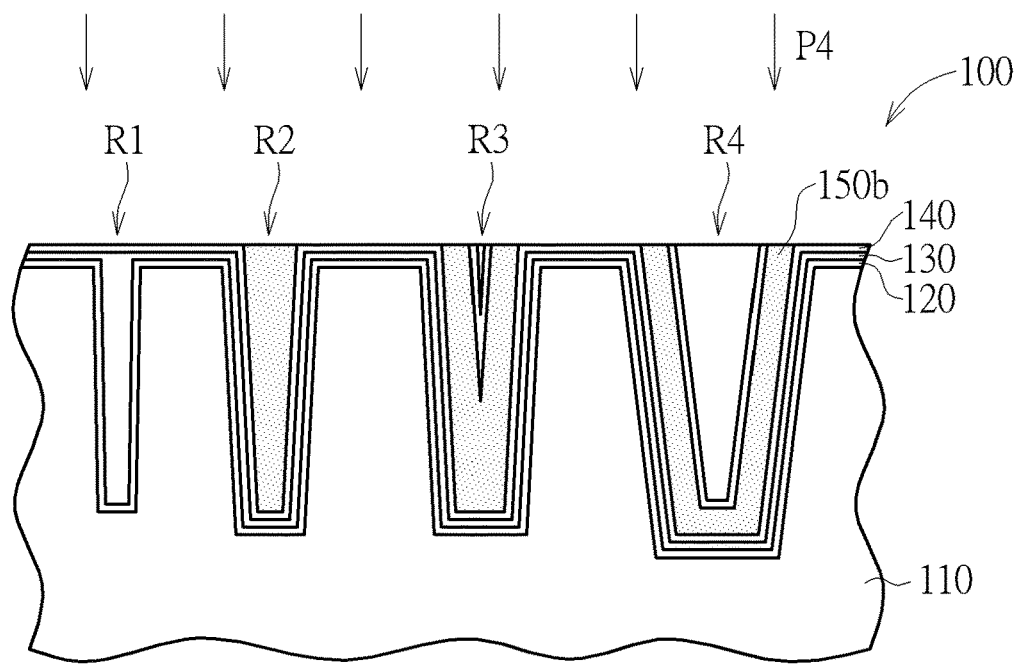
FIG. 8 schematically depicts a cross-sectional view of a method of forming an isolation structure according to an embodiment of the present invention.

Thereafter, a chemical mechanical polishing (CMP) process P4 may be performed to remove a part of the first nitride layer 150, as shown in FIG. 8. In this embodiment, a part of the first nitride layer 150 exceeding from the recesses R1/R2/R3/R4 is removed by the chemical mechanical polishing (CMP) process P4 to expose the oxide layer 140 below the first nitride layer 150, but it is not limited thereto. The polishing process used for removing the part of the first nitride layer 150 has a high etching selectivity, meaning the etching rate of the polishing process to the nitride layer being much higher than the etching rate of the polishing process to the oxide layer, thereby the oxide layer 140 can serving as an etch stop layer while the part of the first nitride layer 150 can being removed, and a first nitride layer 150b being formed. In this way, an isolation structure 100 of the present invention is formed.

To summarize, the present invention provides a method of forming an isolation structure, which forms a first oxide layer conformally covering recesses by an atomic layer deposition (ALD) process; a second oxide layer fills up the recesses by an in-situ steam generation (ISSG) process. This improves gap filling capability of the recesses with high aspect ratio. Stresses in different directions are uniform by filling the second oxide layer into the recesses through an in-situ steam generation (ISSG) process, and thus structural bending caused by the stresses can be avoided.

The second oxide layer may fill up recesses with high aspect ratio, but partially fill the other recesses with larger openings, and then these recesses with larger openings may be filled up by nitride layers or/and oxide layers in later processes. In one case, the first oxide layer is formed by an atomic layer deposition (ALD) process, and the first oxide layer may seal or unseal the recesses with high aspect ratio, and then the second oxide layer fills up voids in the recesses by an in-situ steam generation (ISSG) process.

In one embodiment, a first nitride layer is formed on the second oxide layer after the second oxide layer fills up the recesses by an in-situ steam generation (ISSG) process. Thereafter, the first nitride layer is etched back, so that the first nitride layer is thinned down (wherein the first nitride layer may be thinned down until the second oxide layer being exposed), thereby gap filling can being easier. Moreover, annealing processes may be performed to cure or densify the isolation structure, or polishing processes may be performed to approach the isolation structure having a desired height.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming an isolation structure, comprising:
providing a substrate having a first trench, a second trench and a third trench, wherein the opening of the third trench is larger than the opening of the second trench, and the opening of the second trench is larger than the opening of the first trench;
forming a first oxide layer conformally covering the first trench, the second trench and the third trench by an atomic layer deposition (ALD) process;
filling up the first trench with a second oxide layer by an in-situ steam generation (ISSG) process;
forming a first nitride layer on the second oxide layer, and conformally covering the second trench and the third trench; and
forming a third oxide layer conformally covering the first nitride layer by an atomic layer deposition (ALD) process.

2. The method of forming an isolation structure according to claim 1, wherein the second trench and the third trench are partially filled by the second oxide layer while the first trench is filled up.

3. The method of forming an isolation structure according to claim 1, wherein the opening of the first trench is sealed by the first oxide layer while the first oxide layer is formed, and at least a void is in the first trench.

4. The method of forming an isolation structure according to claim 3, wherein the void is filled up by the second oxide layer.

5. The method of forming an isolation structure according to claim 1, wherein the first nitride layer is formed by an atomic layer deposition (ALD) process.

6. The method of forming an isolation structure according to claim 1, further comprising:
etching back the first nitride layer right after the first nitride layer is formed.

7. The method of forming an isolation structure according to claim 1, further comprising:
performing a spin-on-dielectric (SOD) process to fill up the second trench and the third trench with a fourth oxide layer after the third oxide layer is formed.

8. The method of forming an isolation structure according to claim 7, further comprising:
performing a first annealing process on the fourth oxide layer.

9. The method of forming an isolation structure according to claim 8, wherein the processing temperature of the first annealing process is 900° C.

10. The method of forming an isolation structure according to claim 1, further comprising:
performing a chemical mechanical polishing (CMP) process to polish the fourth oxide layer until the first nitride layer being exposed.

11. The method of forming an isolation structure according to claim 10, further comprising:
performing a second annealing process after the chemical mechanical polishing (CMP) process is performed.

12. The method of forming an isolation structure according to claim 11, wherein the processing temperature of the second annealing process is 1000° C.

13. The method of forming an isolation structure according to claim 10, further comprising:
removing a part of the first nitride layer.

14. The method of forming an isolation structure according to claim 1, further comprising:
forming a fifth oxide layer conformally covering the second oxide layer by an atomic layer deposition (ALD) process before the first nitride layer is formed.

15. A method of forming an isolation structure, comprising:
providing a substrate having a first trench, a second trench and a third trench, wherein the opening of the third trench is larger than the opening of the second trench, and the opening of the second trench is larger than the opening of the first trench;
forming a first oxide layer conformally covering the first trench, the second trench and the third trench by an atomic layer deposition (ALD) process, wherein the opening of the first trench is sealed by the first oxide layer while the first oxide layer is formed, and at least a void is in the first trench; and
filling up the first trench with a second oxide layer by an in-situ steam generation (ISSG) process.

* * * * *